United States Patent
Luo et al.

(10) Patent No.: US 8,987,127 B2
(45) Date of Patent: Mar. 24, 2015

(54) METHOD FOR MANUFACTURING SEMICONDUCTOR DEVICE

(75) Inventors: Jun Luo, Beijing (CN); Chao Zhao, Kessel-lo (BE); Huicai Zhong, San Jose, CA (US); Junfeng Li, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/361,944

(22) PCT Filed: Mar. 23, 2012

(86) PCT No.: PCT/CN2012/072984
§ 371 (c)(1),
(2), (4) Date: May 30, 2014

(87) PCT Pub. No.: WO2013/078803
PCT Pub. Date: Jun. 6, 2013

(65) Prior Publication Data
US 2014/0302644 A1  Oct. 9, 2014

(30) Foreign Application Priority Data

Nov. 30, 2011  (CN) .......................... 2011 1 0391447

(51) Int. Cl.
*H01L 21/00* (2006.01)
*H01L 21/28* (2006.01)
*H01L 29/66* (2006.01)
*H01L 29/78* (2006.01)
*H01L 21/283* (2006.01)

(52) U.S. Cl.
CPC ...... *H01L 21/28097* (2013.01); *H01L 29/6659* (2013.01); *H01L 29/7833* (2013.01); *H01L 21/283* (2013.01); *H01L 29/66477* (2013.01); *H01L 29/66772* (2013.01)
USPC .......................................... 438/592; 438/682

(58) Field of Classification Search
USPC .......................................... 438/592, 682, 585
See application file for complete search history.

(56) References Cited

U.S. PATENT DOCUMENTS

| 6,294,434 | B1 | 9/2001 | Tseng |
| 7,781,322 | B2 * | 8/2010 | Ku et al. ........................ 438/592 |
| 2008/0124922 | A1 | 5/2008 | Kawamura et al. |

FOREIGN PATENT DOCUMENTS

CN 101197286 A 6/2008

OTHER PUBLICATIONS

International Search Report for Application No. PCT/CN2012/072984 mailed Sep. 6, 2012, and its English translation thereof.
Written Opinion of the ISA, ISA/CN for PCT/CN2012/072984, mailed Sep. 6, 2012.

* cited by examiner

Primary Examiner — Richard Booth
(74) Attorney, Agent, or Firm — Harness, Dickey & Pierce, P.L.C.

(57) ABSTRACT

The present invention discloses a method for manufacturing a semiconductor device, comprising: forming a gate stacked structure on a silicic substrate; depositing a Nickel-based metal layer on the substrate and the gate stacked structure; performing a first annealing so that the silicon in the substrate reacts with the Nickel-based metal layer to form a Ni-rich phase of metal silicide; performing an ion implantation by implanting doping ions into the Ni-rich phase of metal silicide; performing a second annealing so that the Ni-rich phase of metal to silicide is transformed into a Nickel-based metal silicide source/drain, and meanwhile, forming a segregation region of the doping ions at an interface between the Nickel-based metal silicide source/drain and the substrate. The method for manufacturing the semiconductor device according to the present invention performs the annealing after implanting the doping ions into the Ni-rich phase of metal silicide, thereby improving the solid solubility of the doping ions and forming a segregation region of highly concentrated doping ions, thus the SBH between the Nickel-based metal silicide and the silicon channel is effectively reduced, and the driving capability of the device is improved.

9 Claims, 4 Drawing Sheets

METHOD FOR MANUFACTURING SEMICONDUCTOR DEVICE

CROSS REFERENCE TO RELATED APPLICATION

This application is a national stage application, filed under 35 U.S.C. §371, of PCT Application No. PCT/CN2012/072984, filed on Mar. 23, 2012, entitled "METHOD FOR MANUFACTURING SEMICONDUCTOR DEVICE", which claimed priority to Chinese Application No. 201110391447.2, filed on Nov. 30, 2011, all of which are hereby incorporated by reference in their entirety.

FIELD

The present invention relates to a method for manufacturing a semiconductor device, and particularly, to a method for manufacturing an MOSFET capable of effectively reducing the Schottky barrier height is between metal silicide/silicon.

BACKGROUND

As the conventional MOSFET device is continuously downsized in proportion, the source/drain resistance is not proportionally reduced along with the decrease of the channel size, and particularly, the contact resistance is increased approximately by being squared along with the size decrease, thus the equivalent working voltage is decreased, and the properties of the device downsized in proportion are greatly influenced. In the prior art for manufacturing an MOSFET, if the conventional highly doped source/drain is replaced by a metal silicide source/drain, the parasitic series resistance and the contact resistance can be significantly reduced.

FIG. 1 is a schematic view of the existing metal silicide source/drain MOSFET (also referred to as Schottky barrier source/drain MOSFET). Metal silicide source/drain regions 3A and 3B are formed on the two sides of a channel region 2A or 2B in a bulk silicon substrate 1A or a Silicon-On-Insulator (SOI) substrate 1B. A gate structure 4A/4B and a gate sidewall spacer 5A/5B are successively formed in the channel region. In which, the metal silicide is completely used as the source/drain material that directly contacts the channel, without the conventional ion implantation procedure for forming a highly doped source/drain. The device substrate may be further provided with a Shallow Trench Isolation (STI) 6A/6B. In FIG. 1, the STI is just shown for the convenience of illustration, rather than being directly interposed between the bulk silicon substrate and the SOI substrate, and those two substrates actually are not connected to each other.

In the Schottky barrier source/drain MOSFET, the driving capability of the device depends on the Schottky Barrier Height (SBH) between the metal silicide source/drain region 3A/3B and the channel region 2A/2B. The driving current is increased when the SBH is reduced. The device simulation is result shows that when the SBH is reduced to about 0.1 eV, the metal silicide source/drain MOSFET can achieve a driving capability the same as that of the conventional large-size highly doped source/drain MOSFET.

The metal silicide is usually Nickel-based metal silicide, such as NiSi, NiPtSi and NiPtCoSi generated through a reaction between Si in the substrate channel region and Ni, NiPt and NiPtCo. Regarding the contact between the Nickel-based metal silicide and the silicon, the SBH (or marked as $\Phi_b$) is usually relatively large, such as 0.7 eV. Thus the device has a relatively small driving current, which restricts the application of the new MOSFET that reduces the source/drain resistance through the Nickel-based metal silicide. Therefore, it requires a new device capable of effectively reducing the SBH between the source/drain of the Nickel-based metal silicide and the silicon channel, and a method for manufacturing the same.

FIGS. 2A to 2D are cross-section views of the steps of a method for reducing the SBH between the Nickel-based metal silicide and the silicon by taking the metal silicide as a doped source (SADS). In which, firstly as illustrated in FIG. 2A, a gate stacked structure 4A comprising a gate insulation layer 41 and a gate conduction layer 42 is formed on the substrate 1, and gate sidewall spacers 5A are formed on both sides of the gate stacked structure 4A. Next, as illustrated in FIG. 2B, a Nickel-based metal layer is deposited on the device, usually comprising Ni, NiPt, NiCo, NiTi or a ternary alloy thereof. Then a one-step SALICIDE process (annealing at about 500□ to form a low resistance phase of the Nickel-based metal silicide) or a two-step SALICIDE process (firstly annealing at about 300□ to form a Ni-rich phase, and secondarily annealing at about 500□ after the unreacted metal is removed, to form a low resistance phase of the Nickel-based metal silicide) is performed, so as to consume Si of a part of the substrate 1 and form a source/drain region 3A of the Nickel-based metal silicide therein. Particularly, the current SALICIDE process preferably uses the two-step is annealing method. Next, as illustrated in FIG. 2C, ions are implanted into the source/drain region 3A of the Nickel-based metal silicide, i.e., p-type impurity ions such as boron (B) are implanted for pMOS, while n-type impurity ions such as arsenic (As) are implanted for nMOS. Finally as illustrated in FIG. 2D, a drive annealing is performed, and the implanted ions are gathered and condensed at the interface between the source/drain region 3A and the channel region of the substrate 1 under the driving of the drive annealing (e.g., about 450~850□) to form a condensation region 7 of the impurity ions, thereby effectively reducing the SBH and improving the driving capability of the device.

However, the above method that reduces the SBH using the SADS still has the following deficiency: impurity ions implanted into the source/drain region 3A of the Nickel-based metal silicide have a poor solubility, and large quantity of the implanted ions cannot be solid-soluble in the Nickel-based metal silicide, thus the number of the impurity ions available for reducing the SBH is not enough. By means of grain boundary diffusion, the implanted ions are segregated by grain-boundary diffusion at the interface between the Nickel-based metal silicide and the silicon to form the condensation region 7. But the temperature of the driving annealing is low and is not sufficient to completely activate the segregated impurities, thus the effect on reducing SBH is not significant. Therefore, the above conventional method is not enough to reduce the SBH to a level below 0.1 eV.

In summary, the existing MOSFET cannot effectively reduce the SBH, and then cannot effectively decrease the source/drain resistance and meanwhile effectively improve the driving capability of the device. Thus the electric properties of the semiconductor device are seriously influenced, and it emergently requires a semiconductor device capable of effectively reducing the SBH and a method for manufacturing the same.

SUMMARY

As mentioned above, an object of the present invention is to provide a method for manufacturing a semiconductor device capable of effectively reducing the SBH.

Thus the present invention provides a method for manufacturing a semiconductor device, comprising: forming a gate stacked structure on a silicic substrate; depositing a Nickel-based metal layer on the substrate and the gate stacked structure; performing a first annealing so that the silicon in the substrate reacts with the Nickel-based metal layer to form a Ni-rich phase of metal silicide; performing an ion implantation by implanting doping ions into the Ni-rich phase of metal silicide; performing a second annealing so that the rich-Ni phase metal silicide is transformed into a Nickel-based metal silicide source/drain, and meanwhile, forming a segregation region of the doping ions at an interface between the Nickel-based metal silicide source/drain and the substrate.

In which, the substrate comprises bulk silicon, SOI, GeSi and SiC.

In which, the Nickel-based metal layer comprises Ni, Ni—Pt, Ni—Co and Ni—Pt—Co.

In which, the Nickel-based metal layer has a thickness of about 1 to 100 nm.

In which, the Ni-rich phase of metal silicide comprises $Ni_2Si$, $Ni_3Si$, $Ni_2PtSi$, $Ni_3PtSi$, $Ni_2CoSi$, $Ni_3CoSi$ and $Ni_3PtCoSi$.

In which, the first annealing is performed at 200 to 350□ for 10 to 300 s.

In which, for pMOS, the doping ions comprise B, Al, Ga, In and combinations thereof, and for nMOS, the doping ions comprise N, P, As, O, S, Se, Te, F, Cl and combinations thereof.

In which, the second annealing is performed at 450 to 850° C.

In which, the Nickel-based metal silicide source/drain comprises NiSi, NiPtSi and NiPtCoSi.

The method for manufacturing the semiconductor device according to the present invention performs the annealing after implanting the doping ions into the Ni-rich phase of metal silicide, thereby improving the solid solubility of the doping ions and forming a segregation region of highly concentrated doping ions, thus the SBH between the Nickel-based metal silicide and the silicon is effectively reduced, and the driving capability of the device is improved.

The above object of the present invention and other objects not listed herein are satisfied within the scope of the independent claim of the present application. The embodiments of the present invention are limited by the independent claim, and the specific features are limited by the dependent claims.

BRIEF DESCRIPTION OF THE DRAWINGS

The technical solutions of the present invention are described in detail as follows with reference to the drawings, in which.

DETAILED DESCRIPTION OF THE EMBODIMENTS

The characteristics and technical effects of the technical solutions of the present invention are described in detail as follows with reference to the drawings and in conjunction with the exemplary embodiments, in which a semiconductor device capable of effectively reducing the SBH and a method is for manufacturing the same are disclosed. To be noted, the similar reference signs denote the similar structures. The terms such as "first", "second", "upper" and "lower" occurring in the present application can be used to describe various device structures or manufacturing procedures. Those descriptions do not imply the spatial, sequential or hierarchical relationships between the described device structures or manufacturing procedures unless otherwise specified.

Figure 1:
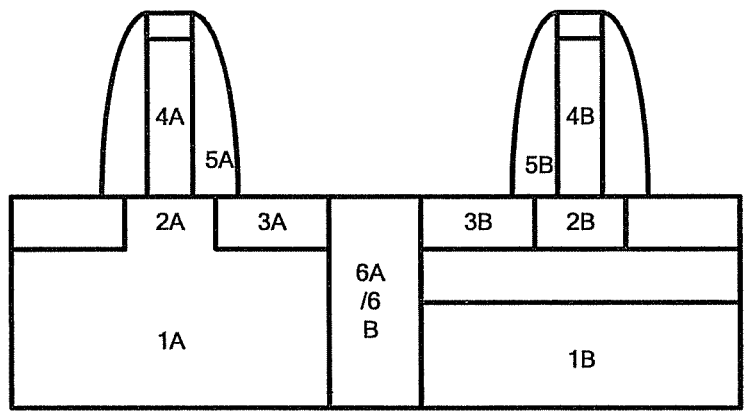
FIG. 1 is a cross-section view of the MOSFET in the prior art.
Figure 2A:
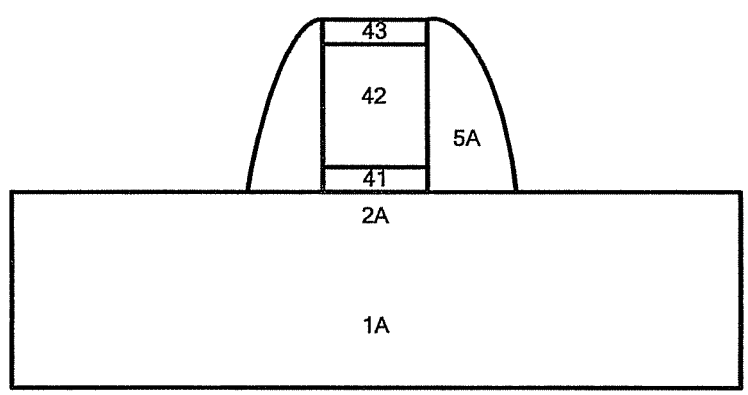
FIGS. 2A to 2D are cross-section views of the steps of a method for reducing the SBH in the prior art.
Figure 2B:
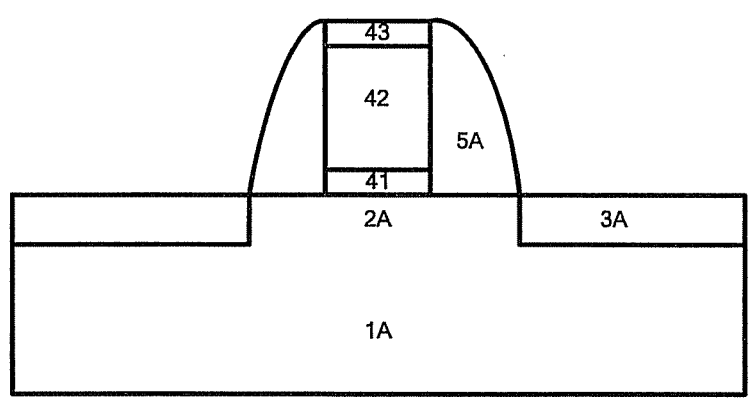
Figure 2C:
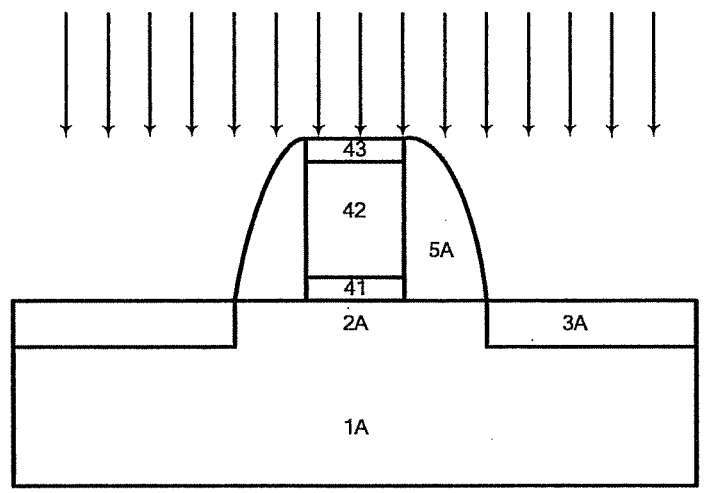
Figure 2D:
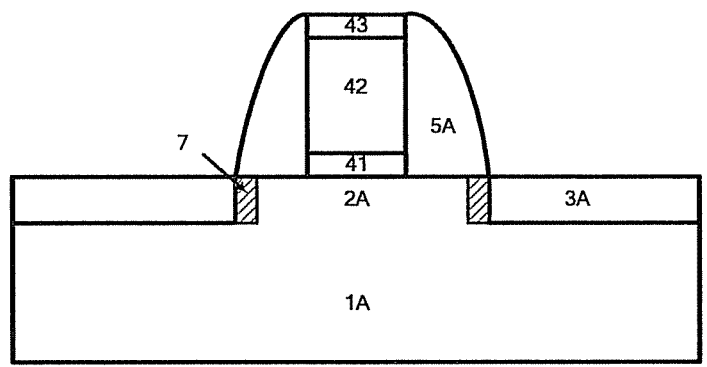
Figure 3:
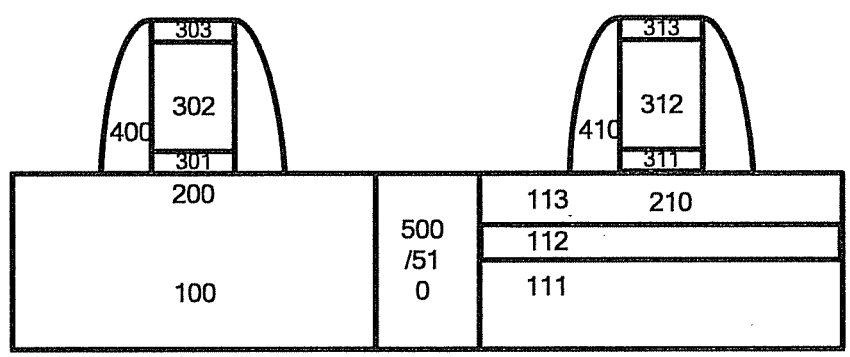
FIGS. 3 to 7 are cross-section views of the steps of a method for reducing the SBH according to the present invention.

Firstly as illustrated in FIG. 3, a substrate and a gate basic structure are formed. Regarding the embodiments of the present invention, the conventional semiconductor substrate can be used, such as the bulk silicon substrate, or other basic semiconductor or compound semiconductor like Ge, SiGe, GaAs, InP or Si:C. According to the design requirement (e.g., p-type substrate or n-type substrate) known in the prior art, the substrate 100 comprises various doped configurations. It may comprise an epitaxial layer or a Semiconductor On Insulator (SOI) structure, and may bear a stress to enhance the performance. Since the present invention uses the metal silicide as the source/drain, the substrate preferably comprises silicon, and the embodiments of the present invention preferably employ an SOI substrate. Specifically, a gate structure 300 or 310 is formed in a channel region 200 or 210 of a bulk substrate 100 or a Silicon On Insulator (SOI) substrate 110. In which, the gate structure 300/310 comprises a gate insulation layer 301/311, a gate conduction layer 302/312 and a gate coverage layer 303/313. A gate sidewall spacer 400 or 410 is formed around the gate structure, and the device substrate may be further provided with a Shallow Trench Isolation (STI) 500/510. In which, the length of the channel region 200/210 is less than or equal to 20 nm, i.e., the device is a sub-20 nm short channel MOSFET. Particularly, the SOI substrate 110 comprises a silicon substrate 111, an oxygen buried layer 112 on the silicon substrate 111, and a top silicon layer 113 on the oxygen buried layer 112. In which, the thickness of the top silicon is layer 113 may be less than or equal to 10 nm. In the step of forming the basic structure, the source/drain implantation is not performed, and the metal silicide source/drain is also not activated.

Figure 4:
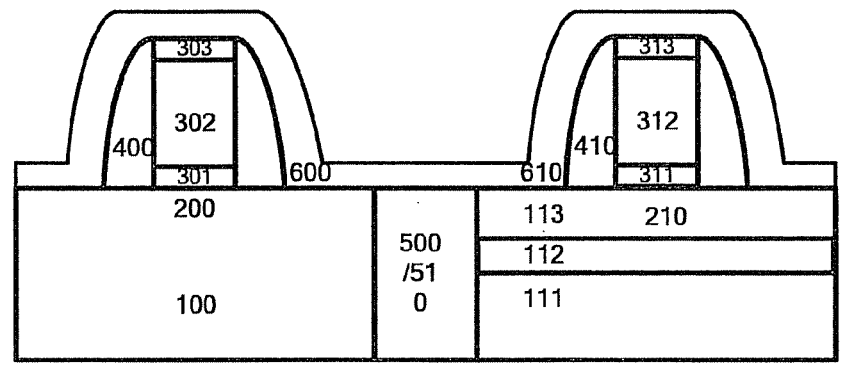

Secondly, a metal layer is deposited. As illustrated in FIG. 4, a metal layer 600/610 for forming the metal silicide is deposited on the whole basic structure, so as to cover the substrate, the gate structure and the gate sidewall spacer. The thin metal layer may be made of Ni, Ni—Pt (the molar content of Pt is less than or equal to 10%), Ni—Co (the molar content of Co is less than or equal to 10%), Ni—Pt—Co (the sum of the molar contents of Pt and Co is less than or equal to 10%), etc. The thin metal layer has a thickness of about 1 nm to 100 nm.

Figure 5:
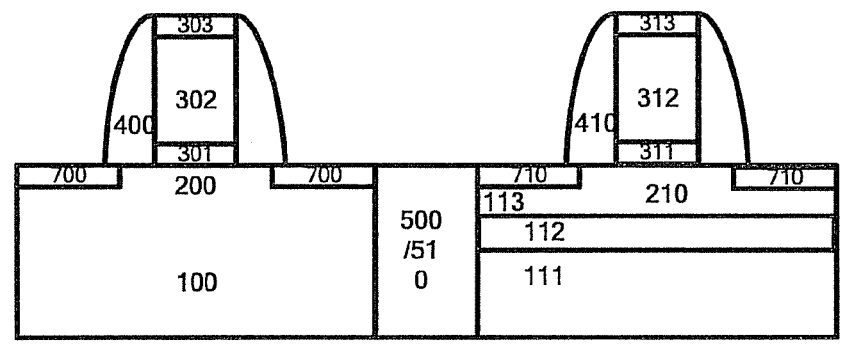

Next, referring to FIG. 5, a first annealing is performed to form a rich-Ni phase silicide. For example, the first annealing may be performed at 200 to 350° C. for 10 s to 300 s, so that the deposited metal layer 600/610 reacts with the silicon in the substrate 100/110 to generate a rich-Ni phase silicide 700/710. The so called rich-Ni phase silicide means that the content of the Nickel-based metal (atomic number) in the silicide is higher than that of Si, and Ni-rich phase of metal silicide specifically may include $Ni_2Si$, $Ni_3Si$, $Ni_2PtSi$, $Ni_3PtSi$, $Ni_2CoSi$, $Ni_3CoSi$, $Ni_3PtCoSi$, etc.

Figure 6:
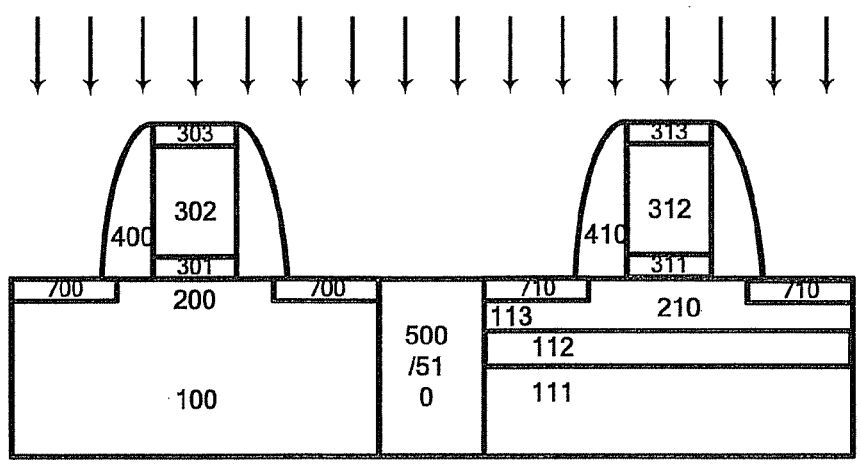

Next, referring to FIG. 6, the unreacted metal layer 600/610 is stripped, and an ion implantation is performed for the Ni-rich phase of metal silicide 700/710 with a dose of about $1\times10^{14}$ cm$^{-2}$ to $1\times10^{16}$ cm$^{-2}$. For pMOS, the doping ions may be boron (B), aluminum (Al), gallium (Ga), indium (In), etc. or combinations thereof. For nMOS, the doping ions may be nitrogen (N), phosphorus (P), arsenic (As), oxygen (O), sulphur (S), selenium (Se), tellurium (Te), fluorine (F), chlorine (Cl), etc. or combinations thereof. The Ni-rich phase of metal silicide may be impaired during the ion implantation, thus the implantation energy should not be too high and should better be sufficiently low to ensure that most of the implanted doping ions are is restricted within the Ni-rich phase of metal silicide. Particularly, the ion implantation in the present invention is performed before the Nickel-based metal silicide source/drain is finally formed, and the implanted ions have a high solid solubility in the Ni-rich phase of metal silicide, thus the ion concentration in the segregation region of the subsequent doping ions can be increased, so as to effectively reduce the SBH.

Figure 7:
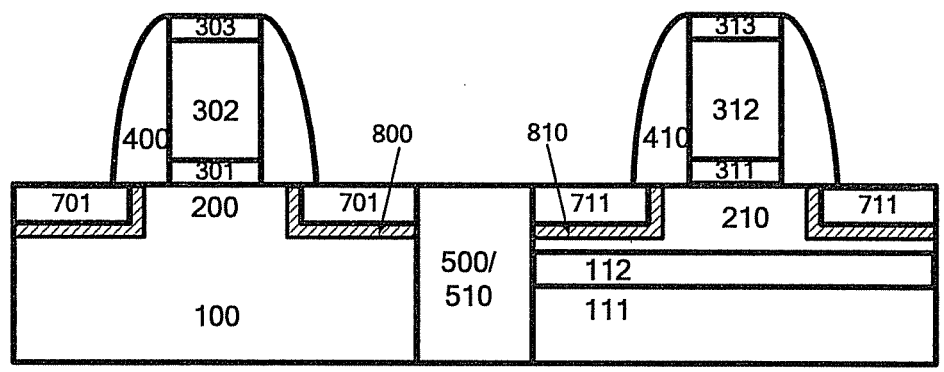

Finally, referring to FIG. 7, a second annealing is performed. The second annealing is performed at 450 to 850° C. to transform the Ni-rich phase of metal silicide 700/710 into a Nickel-based metal silicide 701/711 with a low resistance (specifically including NiSi, NiPtSi, NiPtCoSi, etc.) serving as the source/drain region of the device. Meanwhile, the doping ions are driven to form a segregation region 800/810 of the doping ions at the interface between the Nickel-based metal silicide 701/711 and the substrate 100/110. Specifically, the segregation region 800/810 of the doping ions is located at not only the lower surface of the source/drain region 701/711 made of the Nickel-based metal silicide, but also at the lateral surface of the source/drain region 701/711. The segregation region 800/810 of the doping ions is activated after the second driving annealing at a high temperature, so as to effectively reduce the SBH between the Nickel-based metal silicide 701/711 and the substrate 100/110, and greatly improve the driving capability of the device.

The method for manufacturing the semiconductor device according to the present invention performs the annealing after implanting the doping ions into the Ni-rich phase of metal silicide, thereby improving the solid solubility of the doping ions and forming a segregation region of doping ions with high concentration, thus the SBH between the Nickel-based metal silicide and the silicon is effectively reduced, and the driving capability of the device is improved.

Although the present invention has been described with reference to one is or more exemplary embodiments, a person skilled in the art shall be appreciated that various suitable changes and equivalent modifications can be made to the device structure without deviating from the scope of the present invention. In addition, many modifications suitable for particular situations or materials may be made under the disclosed teaching without deviating from the scope of the present invention. Therefore, the present invention is not limited to the specific embodiments disclosed as the optimum embodiments for implementing the present invention, and the disclosed device structure and the method for manufacturing the same include all the embodiments falling within the scope of the present invention.

What is claimed is:

1. A method for manufacturing a semiconductor device, comprising:
   forming a gate stacked structure on a silicon substrate;
   depositing a Nickel-based metal layer on the substrate and the gate stacked structure;
   performing a first annealing so that the silicon in the substrate reacts with the Nickel-based metal layer to form a Ni-rich phase of metal silicide;
   performing an ion implantation by implanting doping ions into the Ni-rich phase of metal silicide;
   performing a second annealing so that the Ni-rich phase of metal silicide is transformed into a Nickel-based metal silicide source/drain, and meanwhile, forming a segregation region of the doping ions at an interface between the Nickel-based metal silicide source/drain and the substrate.

2. The method for manufacturing a semiconductor device according to claim 1, wherein the substrate comprises bulk silicon, SOI, GeSi and SiC.

3. The method for manufacturing a semiconductor device according to claim 1, wherein the Nickel-based metal layer comprises Ni, Ni—Pt, Ni—Co and Ni—Pt—Co.

4. The method for manufacturing a semiconductor device according to claim 1, wherein the Nickel-based metal layer has a thickness of about 1 to 100 nm.

5. The method for manufacturing a semiconductor device according to claim 1, wherein the Ni-rich phase of metal silicide comprises $Ni_2Si$, $Ni_3Si$, $Ni_2PtSi$, $Ni_3PtSi$, $Ni_2CoSi$, $Ni_3CoSi$ and $Ni_3PtCoSi$.

6. The method for manufacturing a semiconductor device according to claim 1, wherein the first annealing is performed at 200 to 350° C. for 10 to 300 s.

7. The method for manufacturing a semiconductor device according to claim 1, wherein for pMOS, the doping ions comprise B, Al, Ga, In and combinations thereof, and for nMOS, the doping ions comprise N, P, As, O, S, Se, Te, F, Cl and combinations thereof.

8. The method for manufacturing a semiconductor device according to claim 1, wherein the second annealing is performed at 450 to 850° C.

9. The method for manufacturing a semiconductor device according to claim 1, wherein the Nickel-based metal silicide source/drain comprises NiSi, NiPtSi and NiPtCoSi.

* * * * *